United States Patent
Cogan et al.

(10) Patent No.: US 7,244,970 B2
(45) Date of Patent: Jul. 17, 2007

(54) LOW CAPACITANCE TWO-TERMINAL BARRIER CONTROLLED TVS DIODES

(75) Inventors: Adrian I. Cogan, Redwood City, CA (US); Jin Qiu, San Francisco, CA (US); Richard A. Blanchard, Los Altos, CA (US)

(73) Assignee: Tyco Electronics Corporation, Middletown, PA (US)

( * ) Notice: Subject to any disclaimer, the term of this patent is extended or adjusted under 35 U.S.C. 154(b) by 103 days.

(21) Appl. No.: 11/020,507

(22) Filed: Dec. 22, 2004

(65) Prior Publication Data

US 2006/0131605 A1 Jun. 22, 2006

(51) Int. Cl.
*H01L 29/72* (2006.01)
(52) U.S. Cl. ..................... 257/173; 257/355
(58) Field of Classification Search ............... 257/173, 257/263, 355, 361, 497, 498
See application file for complete search history.

(56) References Cited

U.S. PATENT DOCUMENTS

| | | | | |
|---|---|---|---|---|
| 4,037,245 A | 7/1977 | Ferro | | 257/135 |
| 4,375,124 A | 3/1983 | Cogan | | 438/192 |
| 4,405,932 A | 9/1983 | Ishii et al. | | 257/497 |
| 4,476,622 A | 10/1984 | Cogan | | 438/187 |
| 4,641,174 A * | 2/1987 | Baliga | | 257/264 |
| 4,692,780 A | 9/1987 | Bencuya et al. | | 257/266 |
| 4,751,556 A | 6/1988 | Cogan et al. | | 257/264 |
| 4,845,051 A | 7/1989 | Cogan et al. | | 438/193 |
| 5,150,271 A | 9/1992 | Unterweger et al. | | 361/119 |
| 5,321,283 A | 6/1994 | Cogan et al. | | 257/256 |
| 5,387,805 A | 2/1995 | Metzler et al. | | 257/147 |
| 5,426,323 A | 6/1995 | Reczek et al. | | 257/360 |
| 5,648,664 A | 7/1997 | Rough et al. | | 257/135 |
| 5,880,511 A | 3/1999 | Yu et al. | | 257/497 |
| 6,015,999 A | 1/2000 | Yu et al. | | 257/497 |
| 6,239,958 B1 | 5/2001 | Kato et al. | | 361/56 |
| 6,392,266 B1 | 5/2002 | Robb et al. | | 257/314 |
| 6,489,660 B1 | 12/2002 | Einthoven et al. | | 257/497 |
| 6,597,052 B2 | 7/2003 | Hurkx et al. | | 257/497 |
| 6,600,204 B2 | 7/2003 | Einthoven et al. | | 257/497 |
| 6,602,769 B2 | 8/2003 | Einthoven et al. | | 438/542 |
| 2006/0131605 A1* | 6/2006 | Cogan et al. | | 257/173 |

OTHER PUBLICATIONS

"High Performance Microwave Static Induction Transistors", A. Cogan et al., Proc. International Electronic Devices Meeting (IDEM '83), IEEE, pp. 221-224, Dec. 1983.
"Progress Toward the Ultimate Power Semiconductor Switch", Adrian I. Cogan et al., Powertechnics Magazine, pp. 35-39, Sep. 1986.
"The Bipolar Transistor is Dead, Long Live the Bipolar Transistor!", Bruce Carsten, www.power-tech.com/cartext.htm, (presented in the proceedings of the PCIM conference, 1993).
"Silicon FETs Enter L-Band Power Applications", Adrian I. Cogan et al., RF Design, pp. 40-45, Nov. 1993.
"SLVU2.8-8, EPD TVS Diode Array for ESD and Latch-up Protection", Semtech Corporation, http://semtech.com/pc/download-Document.do?navid=HO,C157, C158,P1482&id=449, revision Dec. 8, 2004.

* cited by examiner

*Primary Examiner*—Mark V. Prenty

(57) ABSTRACT

A two-terminal barrier controlled TVS diode has a depletion region barrier blocking majority carrier flow through the channel region at the vicinity of the cathode region at bias levels below the predetermined clamping voltage applied between the anode electrode and the cathode electrode, and may be arranged such that the anode region provides conductivity modulation by injecting minority carriers into the channel region during conduction of the semiconductor structure. In presently preferred form the majority carriers are electrons and the minority carriers are holes. Fabrication methods are described.

21 Claims, 13 Drawing Sheets

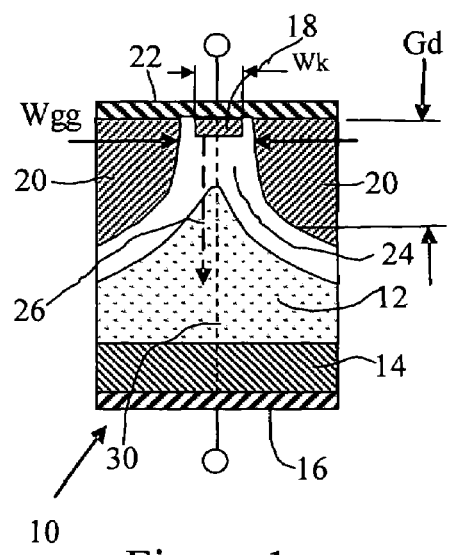
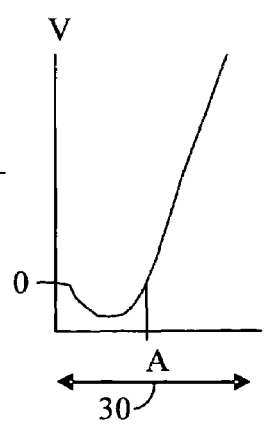
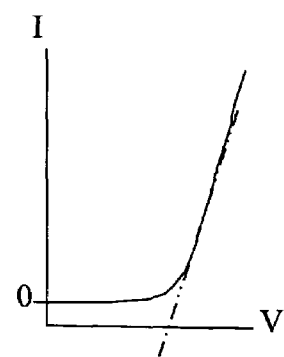
Figure 1     Figure 2     Figure 3
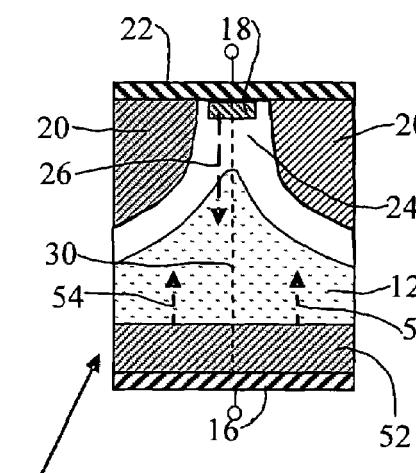
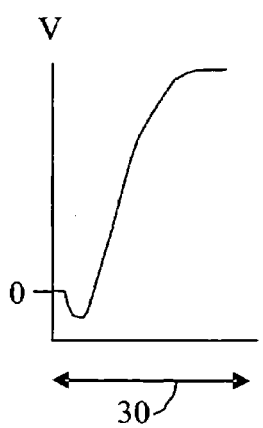
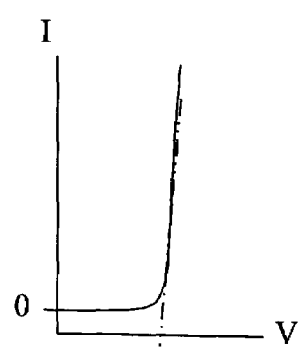
Figure 4     Figure 5     Figure 6

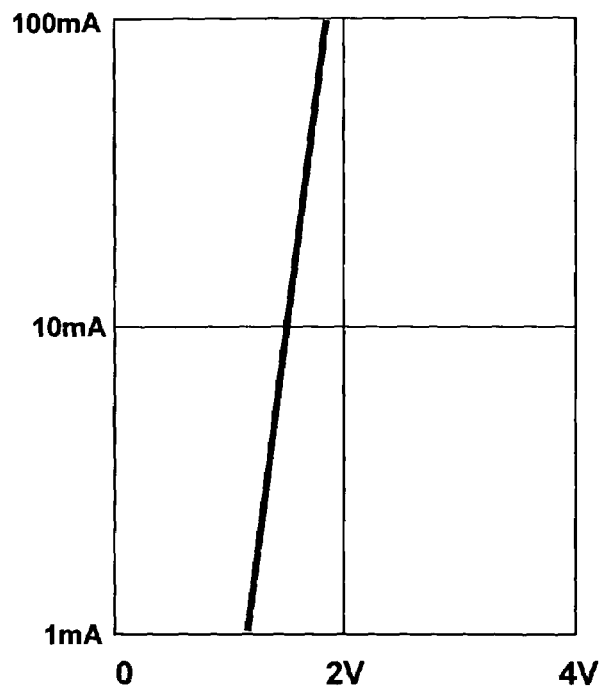
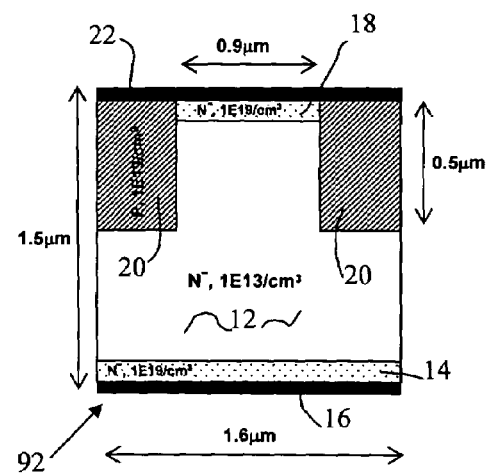
Figure 12A
Figure 12B
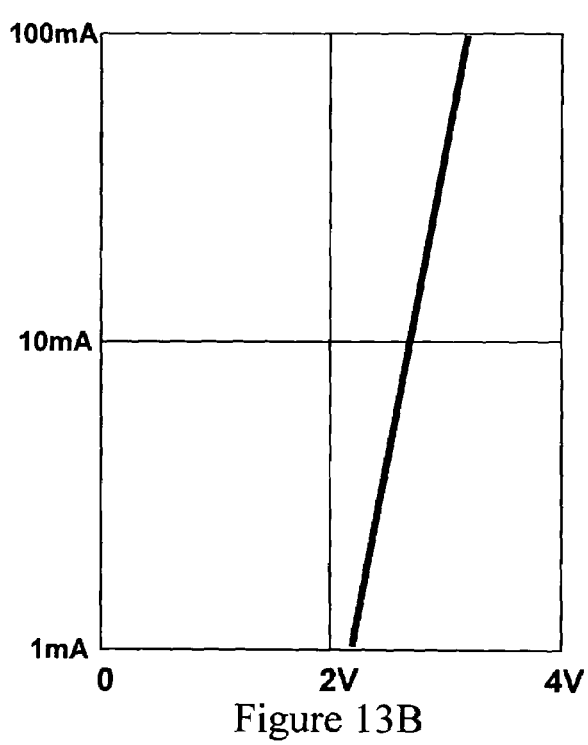
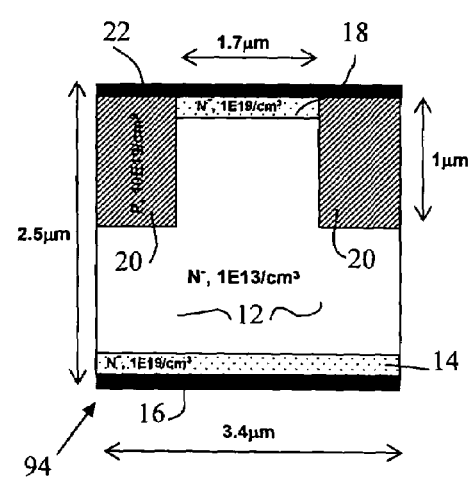
Figure 13A
Figure 13B

LOW CAPACITANCE TWO-TERMINAL BARRIER CONTROLLED TVS DIODES

BACKGROUND OF THE INVENTION

1. Field of the Invention

The present invention relates to electrical circuit components, and more particularly the present invention relates to a two-terminal, low capacitance barrier controlled transient voltage suppression (TVS) semiconductor diode device.

2. Introduction to the Invention

The need to protect electronic circuits and components against over-voltage conditions is well known. In particular, semiconductor devices include structural elements and regions, such as base or gate regions that may be damaged or destroyed if an energy pulse in excess of a maximum voltage rating is permitted to reach the device. Yet, there are several trends emerging that make over-voltage circuit protection ever more challenging. One trend is toward faster data rates. Faster data rates require that protection devices present lower and lower loading impedance, particularly capacitive reactance, at the point of protection of the protected circuit, usually a data or control input base or gate of a semiconductor circuit element.

A second trend is toward circuitry operating at lower voltages, with a pronounced trend from 5-volt logic to 2.8-volt logic and even lower voltages. This trend requires that integrated circuits ("IC") be made with ever-smaller physical features. By reducing IC feature size, increased speeds are achieved. By reducing the voltage, the power dissipated per circuit element is also reduced. Yet, by having smaller feature size, more logic circuit elements are typically included within the overall IC device design; and, with higher data rates, more overall current is required. Thus, the trends to lower feature size and lower voltages combine to result in a net increase in overall current flow through the resultant IC.

One difficulty in protecting ICs has been to realize over voltage protection devices that limit the voltage surge to a predetermined low voltage value or "clamp voltage". Yet another difficulty has been to provide a protection device that presents a relatively low shunt capacitance to the low voltage circuit being protected and that is relatively simple and therefore can be made at relatively low cost.

There are several established approaches to protect electronic circuitry against over-voltage. One approach is to use a simple PN junction diode. For the typical PN silicon diode, the forward conduction voltage is about 0.6 volts. (By forward conduction voltage is meant the forward bias voltage level across the diode at which the current begins dramatically to increase relative to the current previously observed at lower voltages close to the forward conduction voltage. The forward conduction voltage is used herein synonymously with "clamping" voltage.) By putting a single PN junction silicon diode in parallel across an input terminal of a device or element to be protected, a forward bias clamping voltage typically of about 0.6 volts is obtained. In metal-semiconductor junction diodes (Schottky diodes) the forward bias clamping voltage is typically 0.3 volts. Bipolar protection may be achieved by placing two diodes in a back-to-back parallel connection configuration. One well-known drawback of PN junction diodes is that the diode presents a non-linear electrical capacitive reactance at the input of the protected device, with maximum parasitic capacitance typically presented at lowest input potential. The other obvious drawback of the conventional PN junction diode is that it is effective to protect only those signal levels that are below its intrinsic forward conduction voltage, levels that are simply too low for even the low voltage IC circuitry now widely proliferating. A circuit designer could also add plural forward-biased diodes in series as one way of increasing forward conduction voltage and protecting against over voltage surges, whether from ESD or other sources, but, as in the case of single diodes, the I-V characteristics are not very sharp, and therefore the clamping voltage varies significantly with diode forward current, and in a relatively high percentage of cases, with changes in diode temperature.

In order to overcome the fixed low voltage limitations of ordinary PN junction diodes, or metal-semiconductor diodes, designers have also used reverse-biased "Zener" diodes and "avalanche" diodes, either singly or in back-to-back series connection configuration. Zener diodes are made in such a way that their reverse breakdown voltage may be controlled from slightly more than one volt to approximately seven volts. Avalanche diodes are made with reverse breakdown voltages from approximately seven volts to hundreds of volts. Yet, the problem of relatively high parasitic capacitance remains with zener diodes and with avalanche diodes.

Alternatively, relatively complex semiconductor structures known as "transient voltage suppression" (TVS) diodes have been proposed. Two main categories of TVS diodes are well known: avalanche and "punch-through". One example of a punch-through TVS diode is set forth in U.S. Pat. No. 6,015,999 to Yu et al., entitled: "Low-voltage punch-through transient suppressor employing a dual-base structure". Processing of the requisite NPPN multi-layer devices requires relatively expensive, very high resistivity epitaxy and formation of precisely controlled doping gradients during fabrication in order to function as described. These prior devices are therefore complex and costly to make.

A commercial product including an example of the NPPN TVS diode is described in a data sheet entitled "SEMTECH SLVU2.8-8 EPD TVS™ Diode Array for ESD and Latch-Up Protection". Although the device thus described is complex, not easily made and therefore expensive, it does manifest a controllable threshold voltage, desirable I-V characteristics and relatively low loading capacitance. Other U.S. patents relating to punch-through diodes include U.S. Pat. No. 6,602,769 to Einthoven et al.; U.S. Pat. No. 6,600,204 to Einthoven et al.; U.S. Pat. No. 6,597,052 to Hurkx et al.; U.S. Pat. No. 6,489,660 to Einthoven et al.; U.S. Pat. No. 6,392,266 to Robb et al.; U.S. Pat. No. 5,880,511 to Yu et al.; and U.S. Pat. No. 4,405,932 to Ishii et al. Punch-through diodes typically have a PN junction with one side being relatively thin (approximately 1 µm through 5 µm) and of high resistivity (approximately 100 Ω-cm). Low capacitance is achieved as the entire high resistivity region becomes fully depleted at very low reverse voltage levels. Current flow will rapidly increase as the high resistivity region is "punched through" by impurity carriers flowing in response to the relatively low reverse bias voltage. The operation of punch-through diodes is described in the above-referenced patents in greater detail.

Integrated circuits having integral features providing ESD protection are known. One example is U.S. Pat. No. 5,426,323 to Reczek et al., entitled: "Integrated Semiconductor Circuit with ESD Protection. In the approach in the '323 patent, each integrated protection circuit included a field oxide transistor, a field-controlled diode and a diffusion resistor. Another example is provided by U.S. Pat. No. 6,239,958 to Kato et al., entitled: "Electrostatic Damage Protection Circuit and Dynamic Random Access Memory."

The approach disclosed in the '958 patent was to provide depletion mode NMOS or N-channel junction FET transistors to act as resistors during power-off mode of the integrated circuit and bypass voltage surges to a voltage supply bus. During normal powered operation, the FETs became completely depleted and presented very high impedances between the source and drain of an input transistor stage being protected.

Static induction transistors ("SIT") are known in the art. SITs are short channel junction FETs in which the current, flowing vertically between source and drain regions, is controlled by the height of an electrostatically induced potential barrier under the source. The majority carriers in a SIT travel at saturated velocity, making high frequency operation possible in a semiconductor structure that also permits very high bias potentials. SITs also manifest relatively low capacitance between the source and drain regions. See, "High Performance Microwave Static Induction Transistors", co-inventor A. Cogan et al., Proc, IDE'83, IEEE, pp 221–224, for example. Co-inventor A. Cogan is also listed as inventor or co-inventor on inter alia the following U.S. patents relating to SIT: U.S. Pat. Nos. 5,648,664; 5,321,283; 4,845,051; 4,751,556; 4,692,780; 4,476,622; and 4,375,124, the disclosures thereof being incorporated herein by reference thereto.

Devices that are very similar in structure if not in function to static induction transistors are known in the art as three-terminal "field controlled diode structures" ("FCDS"). One example of a field controlled diode is presented in U.S. Pat. No. 4,037,245 to Ferro, entitled: "Electric Field Controlled Diode with a Current Controlling Surface Grid". A FCDS typically includes a uniform anode (minority carrier injection and majority carrier collection) region formed in one major surface of the substrate and a current controlling grid (gate array) at or extending from the other major surface. Interstices of the gate array include cathode regions of high injection efficiency for majority carriers. When a zero bias potential is present at the gate, significant electrical current flows between cathode and anode electrodes. A negative electric bias potential imposed at the gate causes a depletion region to form rapidly around the cathode region and pinch off the unidirectional current flow between anode and cathode. Three-terminal field controlled diodes are said to be able to control unidirectional current flows in magnitudes of up to 1000 Amperes with relatively low gate current flow. A three-terminal field controlled thyristor is proposed by U.S. Pat. No. 5,387,805 to Metzler et al., entitled: "Field Controlled Thyristor".

A hitherto unsolved need has remained for a two-terminal barrier controlled TVS semiconductor diode that provides a factory-set clamping voltage, desirable I-V characteristics, and low capacitance, and that remains simple in design and can be produced at relative low cost.

BRIEF SUMMARY OF THE INVENTION

A general object of the present invention is to provide a low loading impedance two-terminal over voltage protection semiconductor diode emulative of reverse breakdown characteristics of a zener diode, in which a forward bias clamping voltage above PN junction material level (0.6 volts for silicon rectifier devices) is realized as a function of doping, dimensions and device geometry.

Another general object of the present invention is to provide a two-terminal barrier controlled TVS diode that provides a factory-set forward bias clamping voltage, desirable I-V characteristics, low loading capacitance, and that may be implemented with relatively simple designs that can be produced at relative low cost, in a manner overcoming limitations and drawbacks of the prior art.

Another general object of the present invention is to apply and adapt static induction transistor technology to the effective realization of a two-terminal barrier controlled TVS diode having a preset forward bias clamping voltage and low capacitive reactance below the clamping voltage in a manner overcoming limitations and drawbacks of the prior art.

Another general object of the present invention is to apply conductivity modulation in a two-terminal barrier controlled TVS diode having a preset forward bias clamping voltage in a manner providing superior I-V characteristics at the clamping voltage so as to overcome limitations and drawbacks of the prior art.

In accordance with principles and aspects of the present invention, a two-terminal unipolar or bipolar barrier controlled TVS diode is provided for forward conduction at a predetermined clamping voltage level above a level associated with conventional semiconductor material doping level and junction type. The structure includes a semiconductor substrate (that may include an epitaxial layer) having:

(a) a backside anode electrode layer of conductor formed along a back surface of the substrate;

(b) an anode region formed to a predetermined depth in the substrate next to the anode electrode layer and being doped with a first polarity type of impurity carriers in a first concentration;

(c) a transverse channel region formed in the substrate between a lower surface of the anode region and a frontside surface of the substrate, the transverse channel region being lightly doped with a second polarity type or the first polarity type of impurity carriers in a second concentration much lower than the first concentration;

(d) a cathode region formed in the substrate along the frontside surface to a predetermined depth in the substrate and being doped with impurity carriers of the second type in a third concentration much higher than the second concentration;

(e) two gate control regions formed in the substrate along the frontside surface and adjacently opposite and spaced away from the cathode region and being doped with the first type of impurity carriers in a predetermined high concentration and to a predetermined depth into the transverse channel region; and, (f) a frontside cathode electrode layer of conductor formed along the topside surface of the substrate and electrically interconnecting the cathode region and the two gate control regions.

The barrier controlled TVS diode is so arranged as to create a depletion region barrier blocking majority carrier flow through the channel region at the vicinity of the cathode region at bias levels below the predetermined clamping voltage applied between the anode electrode and the cathode electrode. In one presently preferred form the majority carriers are electrons and the minority carriers are holes.

As another aspect of the present invention, a two-terminal barrier controlled bipolar TVS semiconductor diode is provided for forward conduction at a predetermined clamping voltage level above a level associated with conventional semiconductor material doping level and junction type and further includes conductivity modulation. This bipolar TVS diode includes a semiconductor substrate (that may include an epitaxial layer) having:

(a) a backside anode electrode layer of conductor formed along a back surface of the substrate;

(b) an anode region formed to a predetermined depth in the substrate next to the anode electrode layer and being highly doped with a first polarity type of impurity carriers in a first concentration;

(c) a transverse channel region formed in the substrate between a lower surface of the anode region and a frontside surface of the substrate, the transverse channel region being lightly doped with a second or first type of impurity carriers in a second concentration much lower than the first concentration;

(d) a cathode region formed in the substrate along the frontside surface to a predetermined depth in the substrate and being doped with impurity carriers of the second type in a third concentration much higher than the second concentration;

(e) two gate control regions formed in the substrate along the frontside surface and adjacently opposite and spaced away from the cathode region and being doped with the first type of impurity carriers in a predetermined high concentration and to a predetermined depth into the transverse channel region; and, (f) a frontside cathode electrode layer of conductor formed along the topside surface of the substrate and electrically interconnecting the cathode region and the two gate control regions.

The semiconductor structure is so arranged as to create a depletion region barrier blocking majority carrier flow through the channel region at the vicinity of the cathode region at bias levels below the predetermined clamping voltage applied between the anode electrode and the cathode electrode, and further arranged in one preferred form such that the backside (anode) region provides conductivity modulation by injection of minority carriers into the channel region during conduction of the semiconductor structure. In presently preferred form the majority (first polarity type) impurity carriers are electrons and the minority (second polarity type) impurity carriers are holes.

As one more aspect of the present invention a method is provided for making a two-terminal short channel barrier control transient voltage suppression (TVS) having forward conduction at a predetermined clamping voltage level above a level associated with conventional semiconductor material doping level and junction type of a semiconductor diode. The TVS diode is so arranged as to create a depletion region barrier blocking majority carrier flow through the channel region at the vicinity of the cathode region at bias levels below the predetermined clamping voltage level applied between a anode electrode and a cathode electrode of the TVS diode. The method for making the TVS diode comprises steps of:

(a) providing a semiconductor substrate doped with majority carriers in a first concentration;

(b) forming a transverse channel region on the substrate by epitaxial deposition, the transverse channel region being lightly doped with majority carriers in a second concentration much lower than the first concentration;

(c) forming a cathode region along a frontside surface of the transverse channel region to a predetermined thickness, the cathode region being doped with majority carriers of the first type in a third concentration much higher than the second concentration;

(d) forming gate control regions along the frontside surface and adjacently confronting the cathode region, the gate control regions being doped with minority carriers in a predetermined high concentration and to a predetermined depth into the transverse channel region, the predetermined depth of each of the gate control regions being at least as great as a distance between the two gate control regions and including the cathode region;

(e) forming a backside anode electrode conductor along a backside of the substrate; and, (f) forming a frontside cathode electrode conductor layer along the topside surface of the substrate so as electrically to interconnect the cathode region and the two gate control regions.

These and other objects, advantages, aspects and features of the present invention will be more fully understood and appreciated upon consideration of the detailed description of preferred embodiments presented in conjunction with the following drawings.

BRIEF DESCRIPTION OF THE DRAWINGS

The invention is illustrated by the drawings in which FIG. 1 is a greatly enlarged view in section and elevation of a two-terminal barrier controlled TVS diode in accordance with aspects of the present invention.

FIG. 2 is a graph of a voltage gradient from cathode to anode along a central axis of symmetry of the barrier controlled TVS depicted in FIG. 1.

FIG. 3 is a graph of current versus voltage (I-V) of the barrier controlled TVS diode depicted in FIG. 1.

FIG. 4 is a greatly enlarged view in section and elevation of a two-terminal barrier controlled TVS diode having conductivity modulation in accordance with aspects of the present invention.

FIG. 5 is a graph of a voltage gradient from cathode to anode along a central axis of symmetry of the barrier controlled TVS diode depicted in FIG. 4.

FIG. 6 is a graph of current versus voltage (I-V) of the barrier controlled TVS diode depicted in FIG. 4.

FIG. 12A is a greatly enlarged view in section and elevation of a low voltage two-terminal barrier controlled TVS diode of the present invention; and, FIG. 12B is a graph of current versus voltage (I-V) of the FIG. 12A device.

FIG. 13A is a greatly enlarged view in section and elevation of another low voltage two-terminal barrier controlled TVS diode of the present invention; and, FIG. 13B is a graph of current versus voltage (I-V) of the FIG. 13A device.

DETAILED DESCRIPTION OF THE INVENTION

Figure 4A:
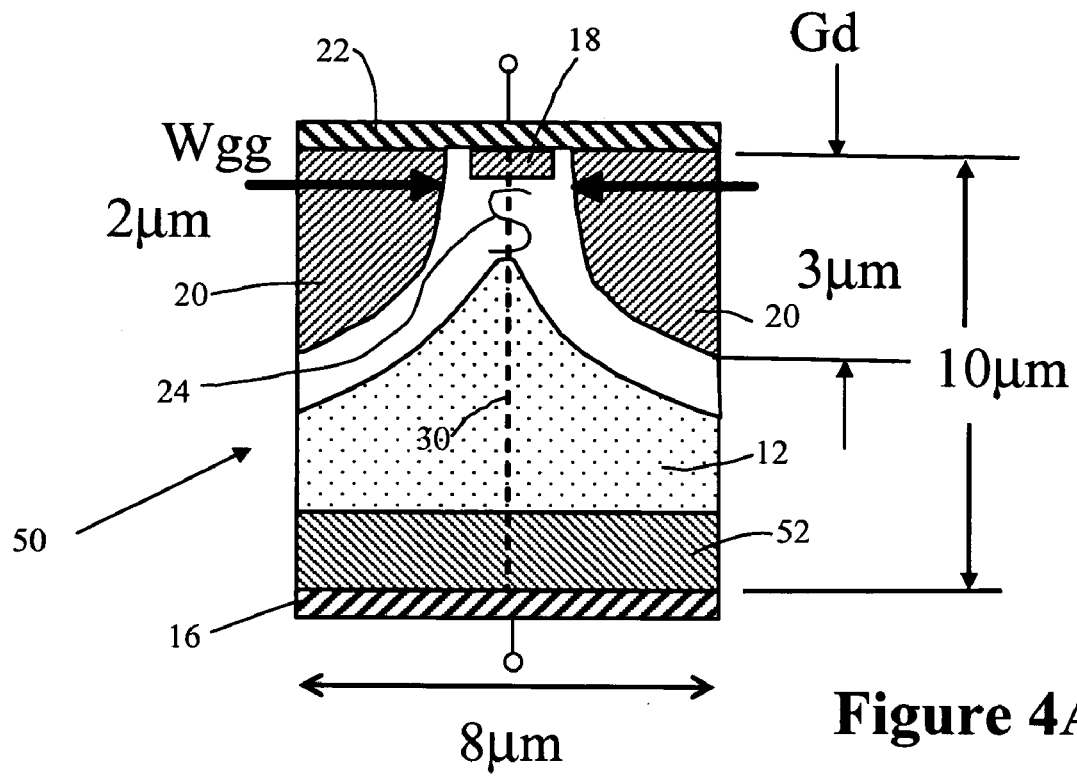
FIG. 4A is a greatly enlarged view in section and elevation of the FIG. 4 two-terminal barrier controlled TVS diode with conductivity modulation, setting forth presently preferred dimensions for some of the structural elements and regions thereof.

In accordance with principles of the present invention, a two-terminal, unipolar, over voltage protection semiconductor device 10 is shown in enlarged diagrammatic cross-section in FIG. 1. The device 10 is two-terminal adaptation and improvement of the static induction transistor. The n-type impurities device 10 includes a silicon epitaxial layer 12 having a relatively low n-type impurities doping level. An anode silicon substrate region 14 having a relatively high n-type impurities doping level and a predetermined thickness extends across a backside major face of the substrate 12. An anode electrode 16 of suitable conductor material, such as aluminum, is formed over the outer major face of the anode region 14 along the substrate backside. At least one cathode region 18 having a relatively high n-type carrier doping level is formed at a region of an opposite major front side face of the substrate 12.

In the arrangement shown in FIG. 1, two relatively deep control gate regions 20 extend downwardly into the substrate 12 adjacently spaced away from the cathode region 18. The control gate regions 20 have a relatively high p-type impurity doping level. A cathode electrode 22 of suitable conductor, such as aluminum, is formed across the opposite major face of the substrate 12 and electrically interconnects the gates 20 and the cathode region 18. In the embodiment of FIG. 1, the cathode electrode 22 has a width Wk that is less than a distance Wgg between oppositely facing regions 20 forming the gate. The gate doping level, the gate depth Gd and the width dimension Wgg between the oppositely facing gate regions establish a depletion region 24 in a channel formed in the substrate 12 from cathode to anode. In the arrangement illustrated in FIG. 1 the gate doping depth Gd is at least as great in magnitude as the width dimension Wgg. The depletion region 24 expands through the N-region 12 and reaches anode region 14 at low bias voltages, or, for certain resistivities and dimensions, at zero bias voltage.

In accordance with principles of the present invention, electron (majority) carrier flow (denoted by arrow 26) from the cathode region 18 to the anode region 20 through the channel can occur only when a positive potential on the anode electrode 16 relative to the cathode electrode 22 overcomes the electron potential barrier under the cathode region 18 and inside the depletion region 24.

A central vertical dividing line having reference numeral 30 divides the device 10 into two generally symmetrical (mirror) halves. The device 10 functions in accordance with a barrier control principle and arrangement. The practical effect of the potential barrier "projected" by the highly doped and relatively deep gate regions 20 relative to the cathode region 18 is graphed in FIG. 2 which presents the electric potential distribution along the line 30 from the cathode region 18 (at zero volts potential) to the anode region 14 (at a positive voltage potential). As one can see from the FIG. 2 graph, in order for electrons to escape the cathode region and cross the control barrier, they must have sufficient energy to do so. This necessary energy level is graphed at point A in FIG. 2.

When the anode electrode 16 is positively biased to a predetermined positive voltage clamping level, the electric field thus created in the channel region between the anode region 14 and the cathode region 18 is sufficient to cause electrons to cross the barrier control region 24, and current flow (arrow 26) thereupon builds rapidly. The clamping voltage is therefore seen to be at a level which is above a level associated with conventionally doped semiconductor material and junction type of diode, for example about 0.6 volts for a doped silicon PN junction diode, and about 0.3 volts for a metal-semiconductor junction of the Schottky diode type.

Positive voltage clamping current, graphed as an exponential I-V curve in FIG. 3, thereupon rapidly develops once the predetermined clamping voltage is reached. The slope of the clamping current is depicted by a straight line tangent to the curve in FIG. 3. The angle of this line relative to the abscissa determines the dynamic range of the device 10, that is, the rate of increase in current for each increment of voltage increase at and above the clamping voltage level. For a circuit protection device, the greater the slope angle of the clamping current relative to voltage the better the dynamic range. The slope angle can be increased by appropriately varying the device doping levels, gradients and dimensions. The slope angle can also be increased by modifying the device gate geometry, as shown in FIGS. 4–10 and discussed hereinafter.

An improvement in dynamic range is realized in the device 50 shown in FIGS. 4, 5 and 6. The device 50 is two-terminal adaptation of the three-terminal field controlled diode. This device 50 operates in accordance with barrier control and conductivity modulation. (The elements of device 50 which are the same as the device 10 have the same reference numeral, and the descriptions previously provided in connection with these common elements apply to the device 50 without repetition.) What is different in the exemplary device 50 is that the anode substrate region 52 is provided with a relatively high p-type minority carrier doping level to a predetermined thickness across the major face of the wafer substrate.

As shown in FIG. 4A, for example, for the device 50 each gate 20 has a depth Gd of about 3 microns; a distance Wgg between the two facing gate regions is about 2 microns; and, the channel depth between cathode 18 and anode region 52 is about 6 microns. As shown in FIG. 4A, the width of the device 50 is approximately 8 microns. With a resistivity of at or over 5 ohm-centimeter, even without negatively biasing the gate regions 20, the built-in potential barrier in epitaxial channel region 12 will fully deplete the depletion region 24.

As shown in FIG. 5, the potential distribution across the depletion region of barrier control TVS diode 50 is essentially the same as in the unipolar diode 10 discussed hereinabove in connection with FIGS. 1, 2 and 3. However, once the clamping voltage level is reached, the current density in the channel is greater, resulting in a steeper current slope and better I-V dynamic range, as shown in FIG. 6, relative to the slope of the unipolar device 10, shown in FIG. 3.

The addition of the PN junction between the anode region 52 and the substrate 12 to the two-terminal device 50 of FIG. 4 enables minority carriers to be injected into the high resistivity region 12, thus increasing conductivity thereof. This phenomenon is known as conductivity modulation, where minority carriers (p-carriers or holes, depicted as arrows 54) are injected from the anode region 52 into the lightly doped channel region 12 during conduction mode. These injected minority carriers 54 greatly increase the number of charge carriers available for conduction and lower the resistance of the channel by orders of magnitude over the unipolar device 10 of FIG. 1. With lower voltage drop during conduction mode, current densities can be increased by orders of magnitude over the unipolar device 10, a very desirable property for an over-voltage protection diode.

The improvement in dynamic range is graphed in the I-V graph of FIG. 6 wherein it is shown that at the device clamping voltage, the slope of the current is markedly greater than the I-V slope of the device 10 shown in FIG. 3. While it is certainly practical to reverse the majority carriers from electrons to holes in the devices 10 and 50 by reversing the impurity doping types of the respective semiconductor regions, electrons as majority carriers are presently preferred because of their higher mobility compared with holes.

Figure 7:
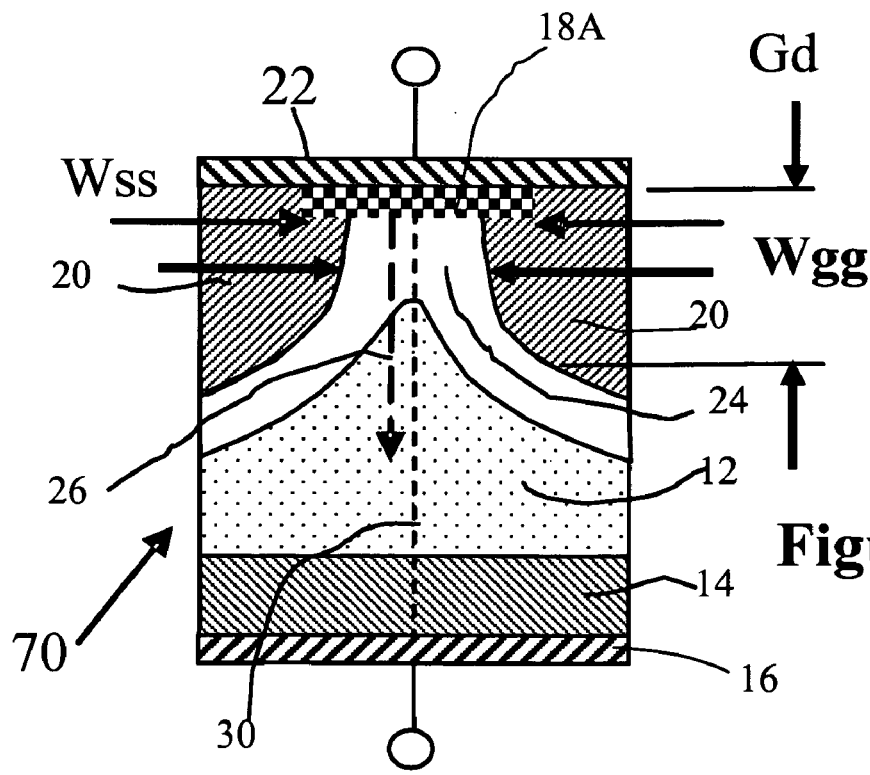
FIG. 7 is a greatly enlarged view in section and elevation of an alternative two-terminal barrier controlled TVS diode having a wide source region in accordance with aspects of the present invention.

FIG. 7 shows a two-terminal barrier controlled TVS diode 70 in accordance with principles of the present invention. The diode 70 has a cathode region 18A, which overlies and intrudes into the gate region diffusions 20 by an amount equal to Wss–Wgg, Wss representing effective lateral width of the cathode region 18A and Wgg representing the distance between oppositely facing regions of the gates 20.

Figure 8:
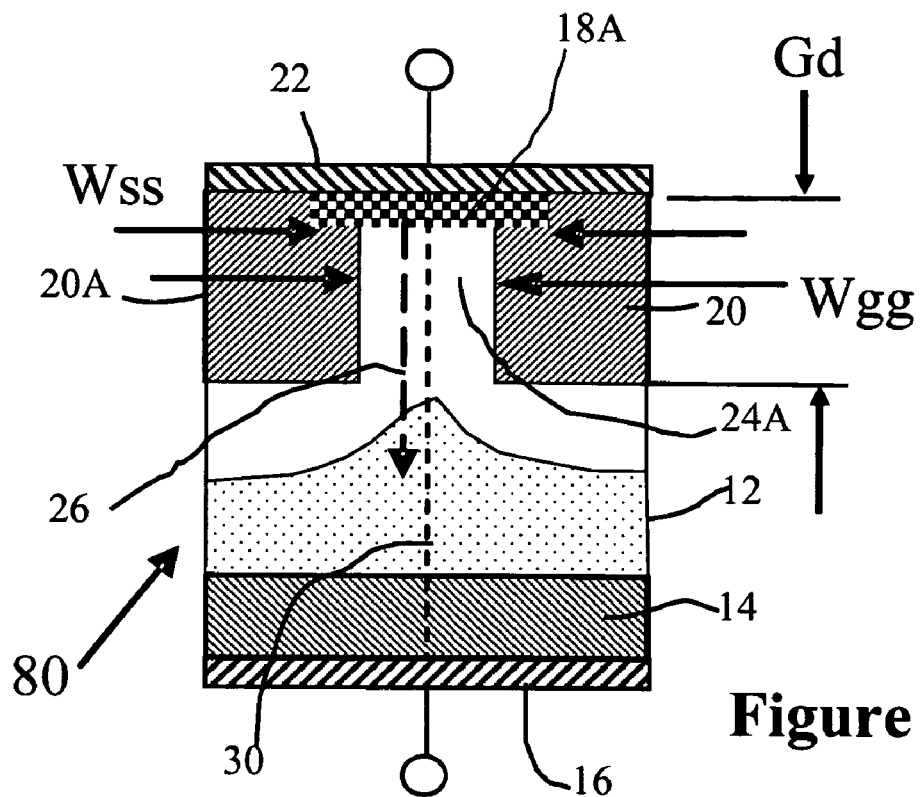
FIG. 8 is a greatly enlarged view in section and elevation of another barrier controlled TVS diode having trench-filled base regions in accordance with aspects of the present invention.

FIG. 8 shows a modification of the FIG. 7 barrier controlled TVS diode 70. The modified two-terminal barrier controlled TVS diode shown in FIG. 8 includes the overlapping cathode region 18A and also shows trenches that have been formed at the gate regions 20, and refilled with doped semiconductor material to form trench gate regions 20A. In this region, the fully depleted region 24A is nominally wider than the region 24 associated with the device 10 of FIG. 1.

Figure 9:
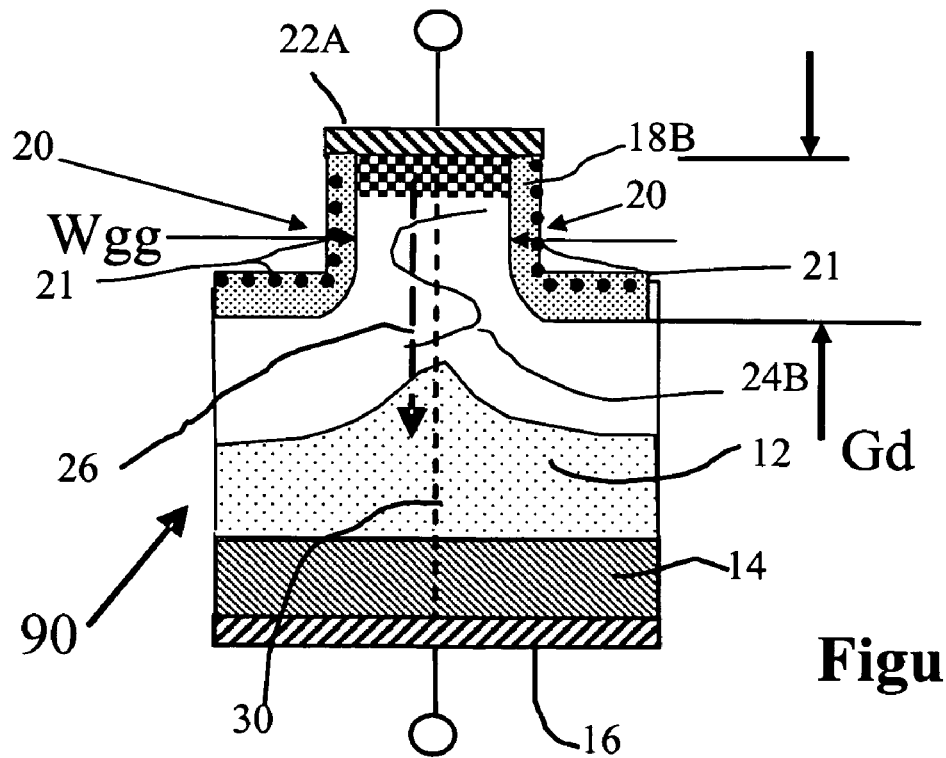
FIG. 9 is a greatly enlarged view in section and elevation of a yet another two-terminal barrier controlled TVS diode having conductivity enhanced, trenched base regions in accordance with aspects of the present invention.

FIG. 9 shows a modification of the FIG. 8 barrier controlled TVS diode 80. In the FIG. 9 two-terminal barrier controlled TVS diode 90, trenches have been formed at the gate regions 20 to a predetermined trench depth, and rather than being refilled with doped semiconductor material, the side and bottom trench walls 21 have been doped by diffusion to a particular depth into the epitaxial layer 12. In this trench isolation embodiment 90 of the barrier control TVS diode, a cathode region 18B is essentially coextensive with a cathode electrode 22A that overlies and connects the side trench walls 21 of base regions 20. The diode 90 shown in FIG. 9 also has a relatively longer fully depleted region 24B than the region 24 associated with device 10 of FIG. 1.

Figure 10A:
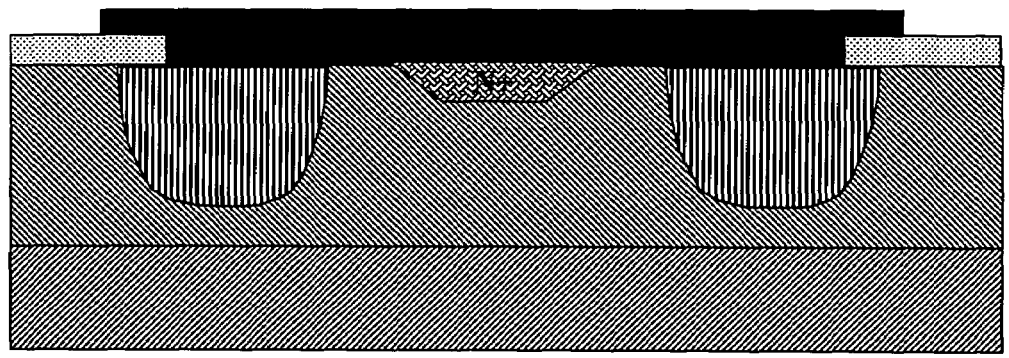
FIGS. 10A, 10B, 10C, 10D, and 10E respectively illustrate a plurality of alternative gate junction structural arrangements for two-terminal barrier controlled TVS diodes of the present invention.
Figure 10B:
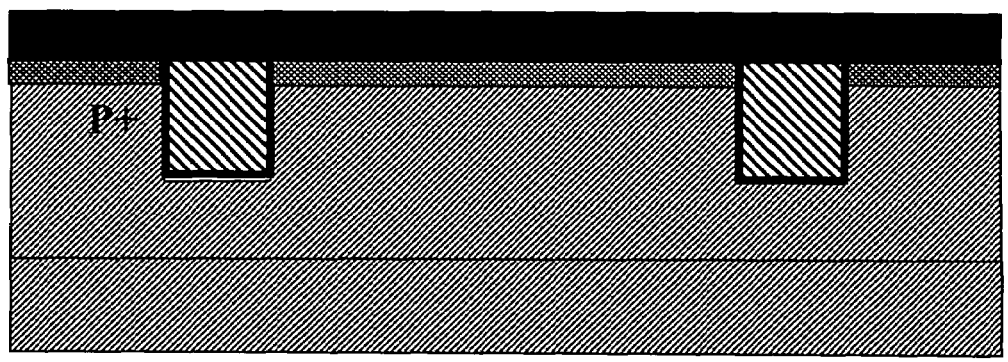
Figure 10C:
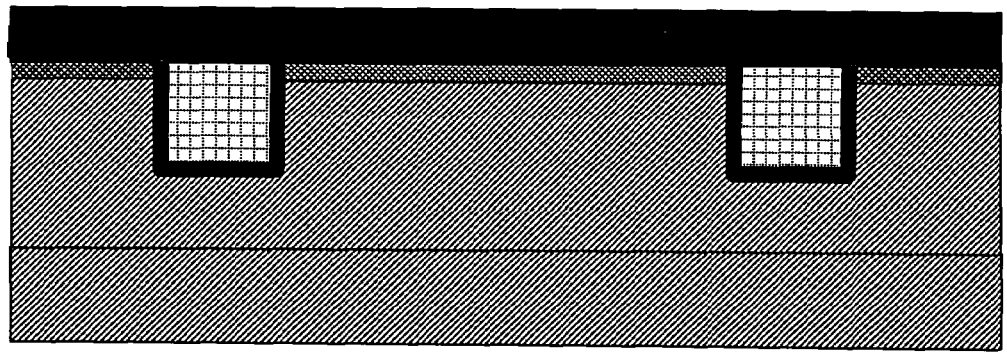

FIGS. 10A, 10B, 10C, 10D and 10E set forth summary views of alternative base structures suitable for two-terminal barrier controlled TVS diodes in accordance with the present invention. FIG. 10A shows a barrier controlled TVS diode having diffused gate regions, similar to the diode 10 of FIG. 1. FIG. 10B shows a barrier controlled TVS diode wherein gate trenches are formed and then refilled with suitably doped semiconductor material, similar to TVS diode 80 of FIG. 8. FIG. 10C shows a barrier controlled TVS diode wherein gate trenches are doped along exposed sidewalls thereof, and then filled with dielectric material, such as $SiO_2$.

Figure 10D:
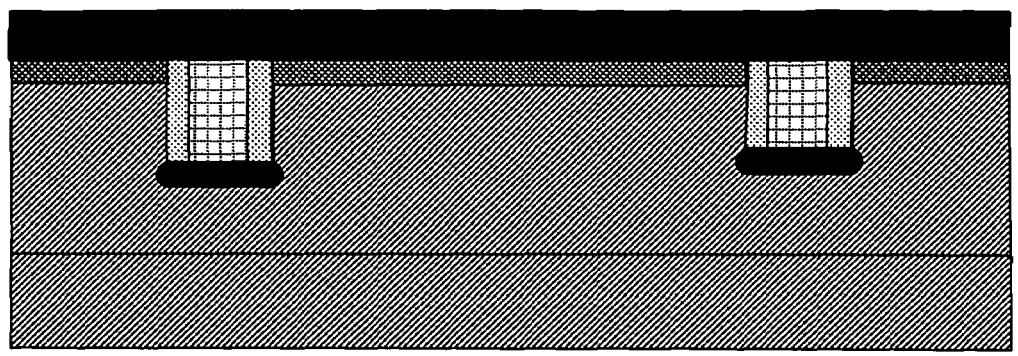
Figure 10E:
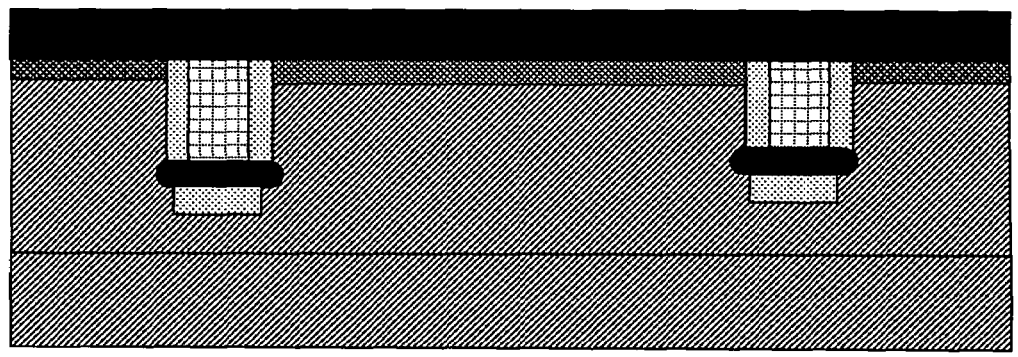

FIG. 10D shows a barrier controlled TVS diode having gate trenches with dopant diffusions formed along the bottom only of the trenches, and conductive material, such as a dopant, formed along sidewalls thereof with a central portion filled with a dielectric material, such as $SiO_2$. FIG. 10E shows a barrier controlled TVS diode having gate trenches, gate bottom region diffusions formed on top of diffusion regions and connected to the cathode region and electrode by sidewall diffusion regions. The remainder of the gate trench is filled with a dielectric material, such as $SiO_2$.

Figure 11A:
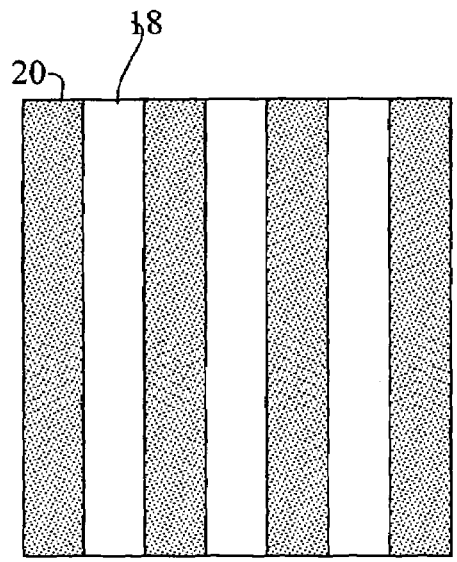
FIGS. 11A, 11B and 11C are greatly enlarged top plan views of source-gate layout arrangements for two-terminal barrier controlled TVS diodes in accordance with the present invention.
Figure 11B:
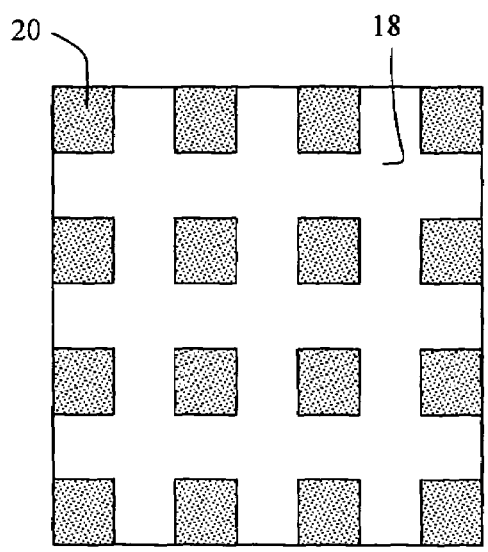
Figure 11C:
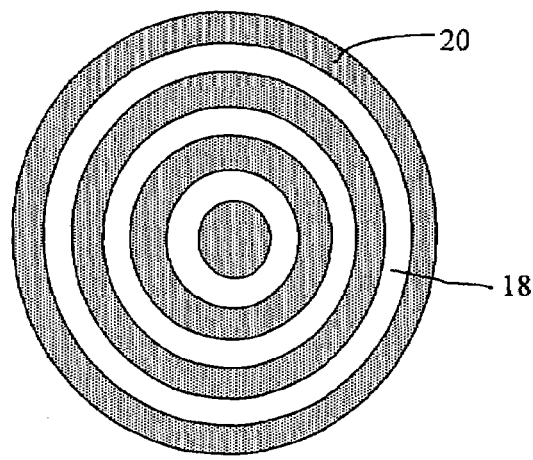

FIGS. 11A, 11B and 11C illustrate a plurality of alternative gate-source layouts for two-terminal barrier controlled TVS diodes. In FIG. 11A, gate and source regions are formed as parallel rows in a generally rectangular or square layout. In FIG. 11B, gate regions are formed checkerboard style as generally square islands regularly spaced apart across the source electrode region. In FIG. 11C, gate and source regions are shown as concentric rings in a generally circular layout.

A two-terminal low voltage barrier controlled TVS device 92 is shown structurally in FIG. 12A and the I-V characteristics thereof are graphed in FIG. 12B. The device 92 is modeled with an area dimension of 1 $mm^2$. Only a small part (1.6 µm) width of the overall device 92 is illustrated in FIG. 12A. In the device 92, the source (anode) region has a width of 0.9 µm between the gate regions 20 and has an N-type dopant concentration 1 $E^{19}/cm^3$. The base regions 20 extend into the channel layer for a distance of 0.5 µm and have P-type dopant concentrations of 1 $E^{19}/cm^3$. The channel region 12 extends for approximately 1.5 µm from the source region 18 to the drain (cathode) region 14 and has an N-type dopant concentration of 1 $E^{13}/cm^3$. Finally, the drain region 14 has an N-type dopant concentration of 1 $E^{19}/cm^3$. As can be seen in the I-V graph of device 92 presented as FIG. 12B, the forward conduction voltage begins at about 1.6 volts and reaches a significant current magnitude at about 1.8 volts.

Another two-terminal low voltage barrier controlled TVS diode 94 is shown in FIG. 13A. Only a small part (3.4 µm) width of the overall device 94 is illustrated in FIG. 13A. In the device 94, the source (anode) region 18 has a width of 1.7 µm between the gate regions 20 and has an N-type dopant concentration 1 $E^{19}/cm^3$. The base regions 20 extend into the channel layer for a distance of 1.0 µm and have P-type dopant concentrations of 10 $E^{19}/cm^3$. The channel region 12 extends for approximately 2.5 µm from the source region 18 to the drain (cathode) region 14 and has an N-type dopant concentration of 1 $E^{13}/cm^3$. Finally, the drain region 14 has an N-type dopant concentration of 1 $E^{19}/cm^3$. As can be seen in the I-V graph of device 94 presented as FIG. 13B, the forward conduction voltage begins at about 2.2 volts and reaches a significant current magnitude at about 3.2 volts.

Figure 14A:
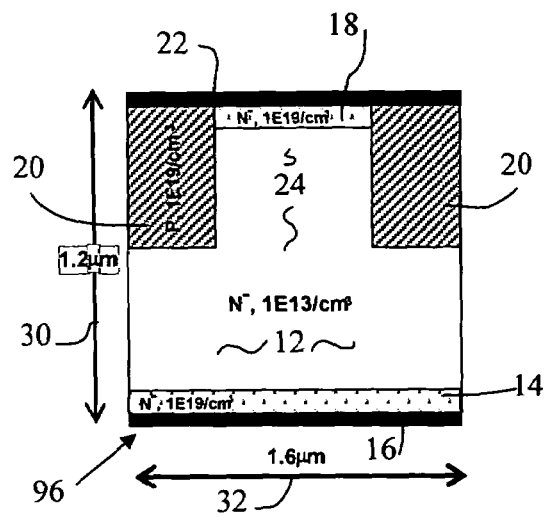
FIG. 14A is a greatly enlarged view in section and elevation of a two-terminal barrier controlled TVS diode of the present invention; and, FIG. 14B is a three dimensional graph of voltage gradient from cathode to anode across the geometry of the FIG. 14A device.
Figure 14B:
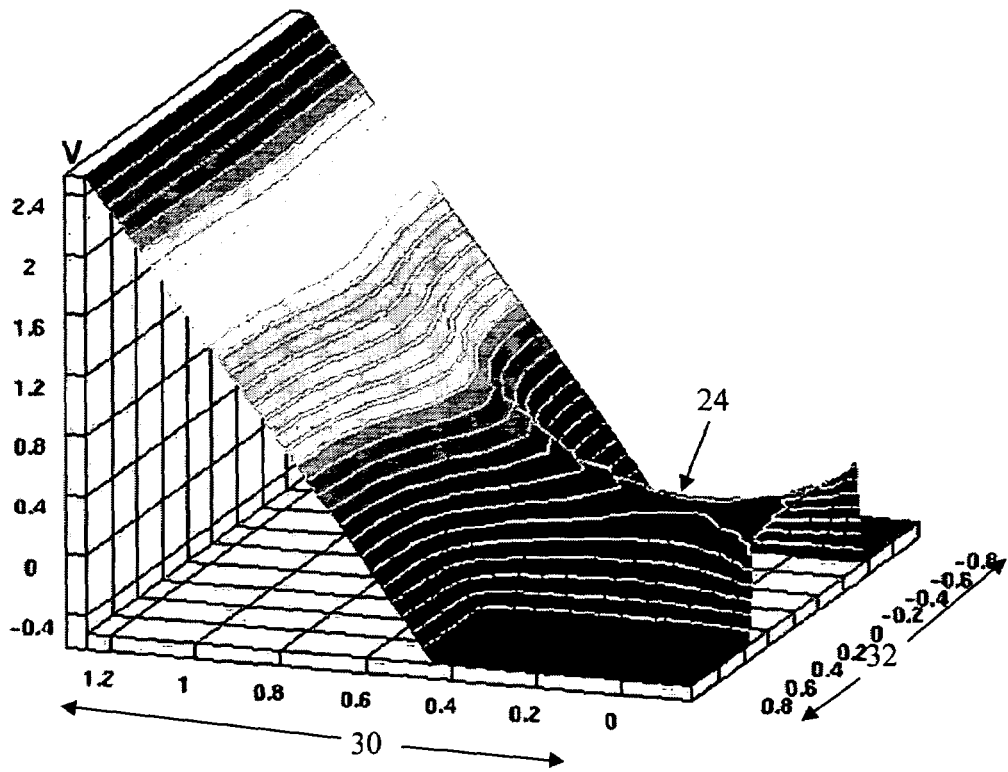

A two-terminal low voltage barrier controlled TVS diode 96 shown in FIG. 14A is similar in structure and dopant concentrations to the diode 92 shown in FIG. 12A, and has a slightly longer dimension between source and drain of 1.2 µm. When bias voltage is applied across the device 96, a depletion region 24 is formed, and this region is illustrated by the three dimensional voltage gradient map set forth as FIG. 14B wherein dimension 30 extends from anode region 18 to cathode region 16 and wherein dimension 32 extends laterally across the illustrated portion of device 96.

Figure 15A:
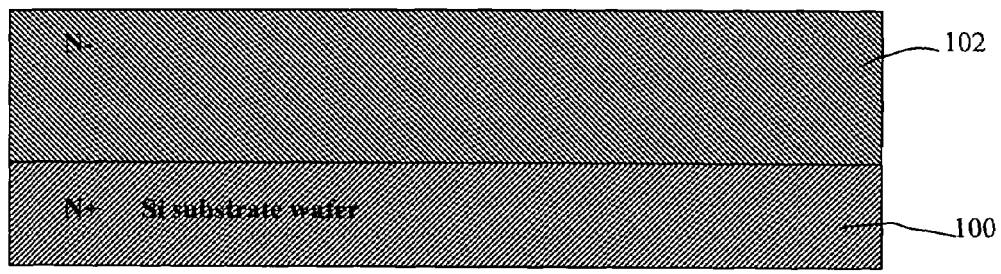
FIGS. 15A, 15B, 15C, 15D, and 15E provide enlarged cross-sectional views illustrating a first series of fabrication steps for making two-terminal barrier controlled TVS diodes in accordance with principles of the present invention.
Figure 15B:
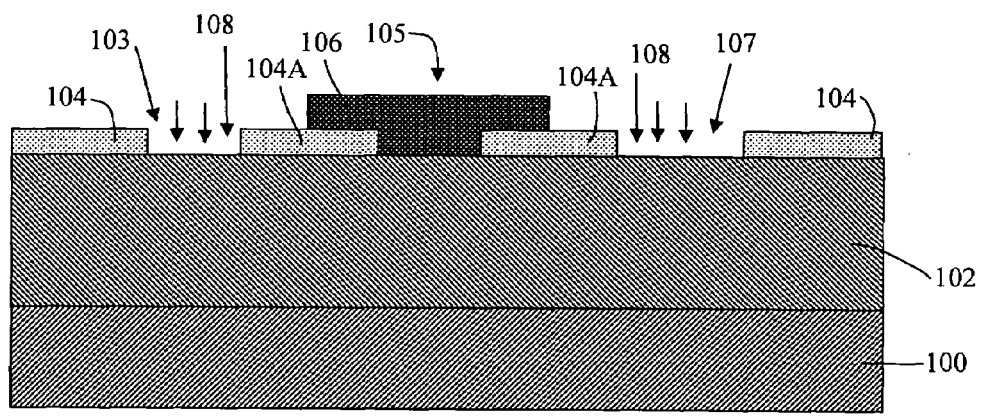
Figure 15C:
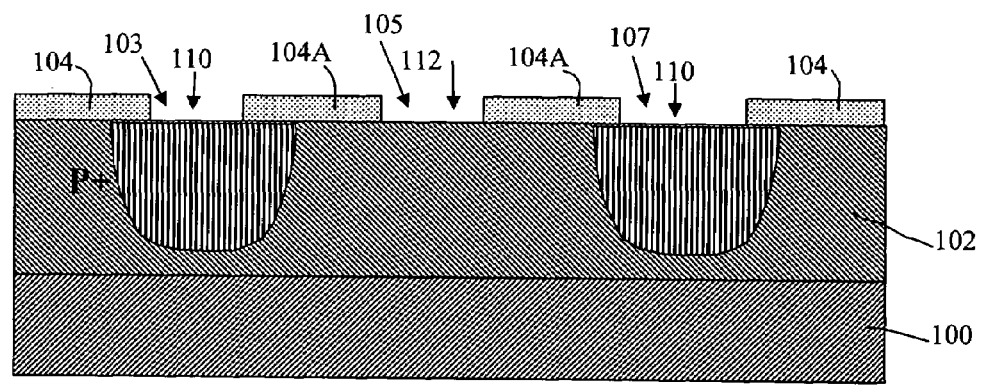
Figure 15D:
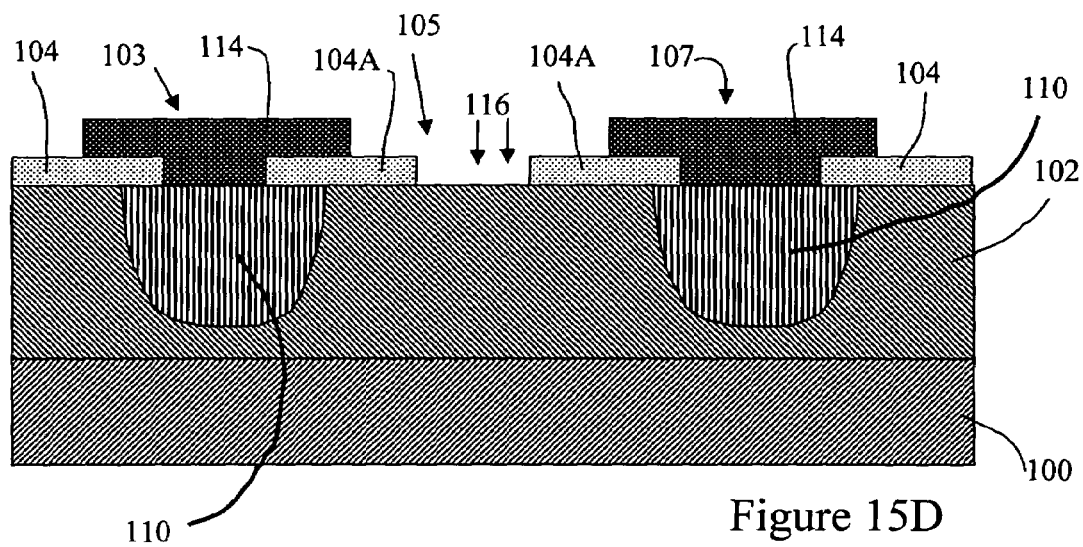
Figure 15E:
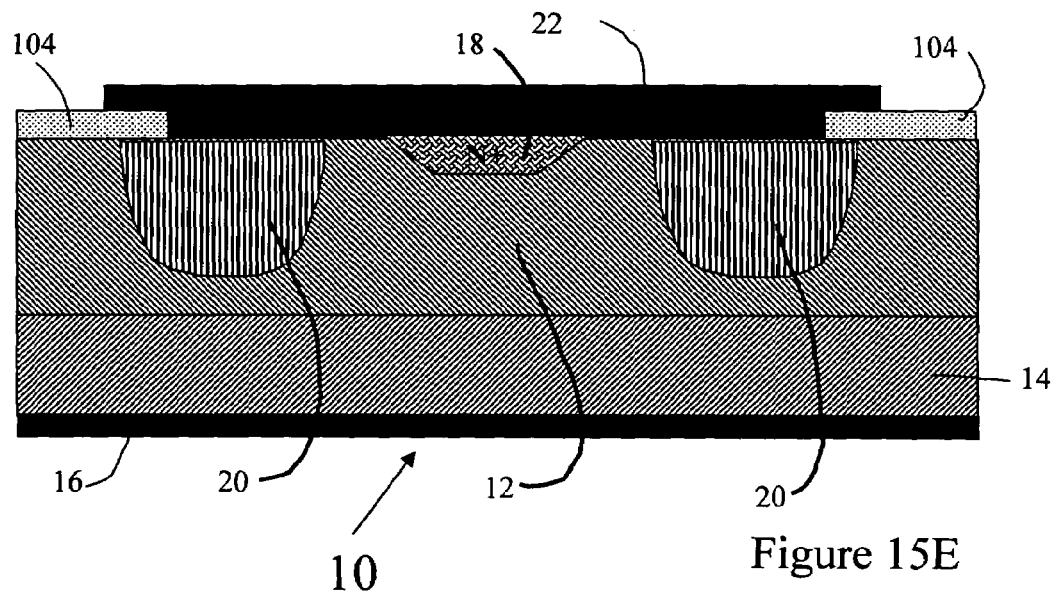

One presently preferred method for making two-terminal barrier controlled TVS diodes in accordance with the present invention is outlined by progressive process steps illustrated in FIGS. 15A, 15B, 15C, 15D, and 15E. In FIG. 15A a silicon substrate wafer 100 doped to a predetermined N+ level is subjected to an epitaxial deposition in order to form a more lightly doped (N−) epitaxial layer 102. In FIG. 15B, an oxidation mask 104 of SiO₂ is deposited on an outer surface of epitaxial layer 102. The mask layer 104 is then selectively etched to define openings 103, 105 and 107. Openings 103 and 107 locate gate diffusion regions, whereas opening 105 locates a cathode region of the barrier control TVS diode. A mask 106 of photoresist material is then selectively deposited over the layer 104 to cover and protect the cathode opening 105. The processed wafer is then subjected to an ion implantation or diffusion of P+ material at a step 108, such as Boron II, at the exposed gate openings 103 and 105. In FIG. 15C, the photoresist mask 106 is removed and the wafer is then subjected to further oxidation and diffusion of Boron II at step 110 to create two P+ gate regions. In FIG. 15D photoresist masks 114 are formed over the base openings 103 and 107 in the oxidation layer 104, and an ion implantation of N+ material, such as Arsenic II, is carried out at the cathode opening 105 at a step 116 to create the highly doped cathode region 18. As shown in FIG. 15E, the photoresist masks 114 are removed, the N+ cathode material is subjected to an annealing process to complete the formation of cathode 18. Oxide mask portions 104A are removed by selective etching; and, a metal deposition (e.g. aluminum) forming cathode electrode 18 is placed at the outer surface of exposed epitaxy layer 102. The metal deposition forms cathode electrode 22 that electrically interconnects the completed gate regions 20 and the cathode region 18. A metal layer (e.g. aluminum) is also deposited along the outer surface of substrate 100 to form anode electrode 12 and anode region 14 of the completed barrier controlled TVS diode 10, for example.

Figure 16A:
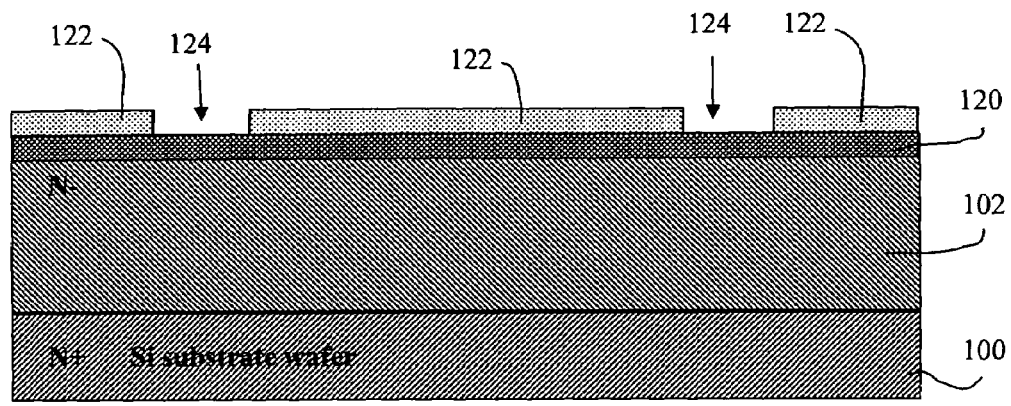
FIGS. 16A, 16B, and 16C provide an alternative series of fabrication steps for making two-terminal barrier controlled TVS diodes of the present invention.
Figure 16B:
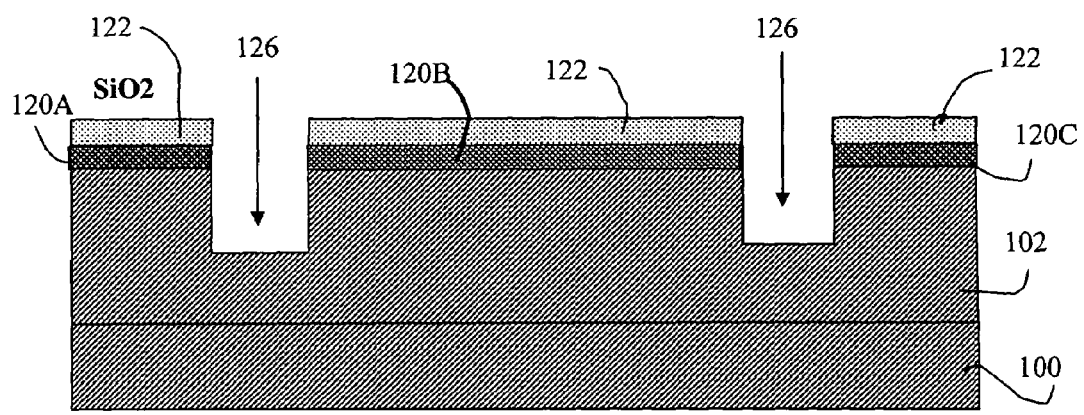
Figure 16C:
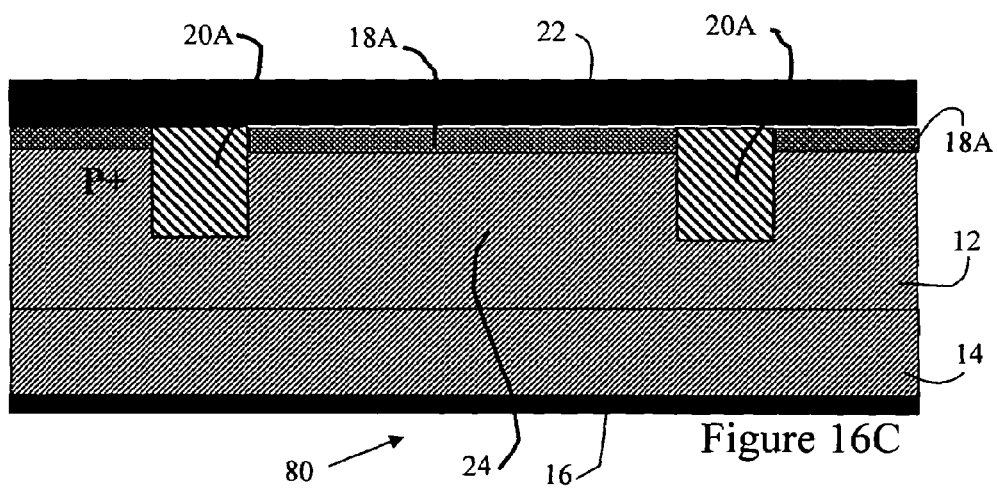

An alternative method for making a two-terminal barrier control TVS diode 80 of FIG. 8 is outlined in FIGS. 16A, 16B and 16C. In FIG. 16A, a N+ silicon substrate wafer 100 has an epitaxially grown silicon layer 102 characterized by an N− dopant concentration. An ion implantation or diffusion of N+ dopant, such as Arsenic II, is then formed across a front side outer surface of the epitaxial layer 102 to form a cathode layer 120. A silicon dioxide mask layer 122 is then formed over the cathode layer 120. Gate trench openings 124 are defined by selective etch through the layer 122 at the locations of gate trenches to be formed. In FIG. 16B the processed wafer is subjected to a trench etch process 126, defining gate trenches extending through the cathode layer 120 and relatively deeply into the epitaxial layer 102. As shown, the gate trenches formed by step 126 divide the cathode layer into segments 120A, 120B and 120C. As shown in FIG. 16C, P+ doped polysilicon is then deposited in the gate trenches to form gate regions 20A. The SiO₂ mask segments 122 are removed. The exposed epitaxial layer surface of the processed wafer is then subjected to a planarization step, and then annealed. A metal layer is then deposited onto the planarized epitaxial layer surface to form the cathode electrode 22, which interconnects gate regions 20A and cathode region 18A. A metal layer is then deposited onto the exposed backside surface of wafer 100 to form anode electrode 16 connecting to region 14 of the completed barrier controlled TVS diode 80.

Figure 17A:
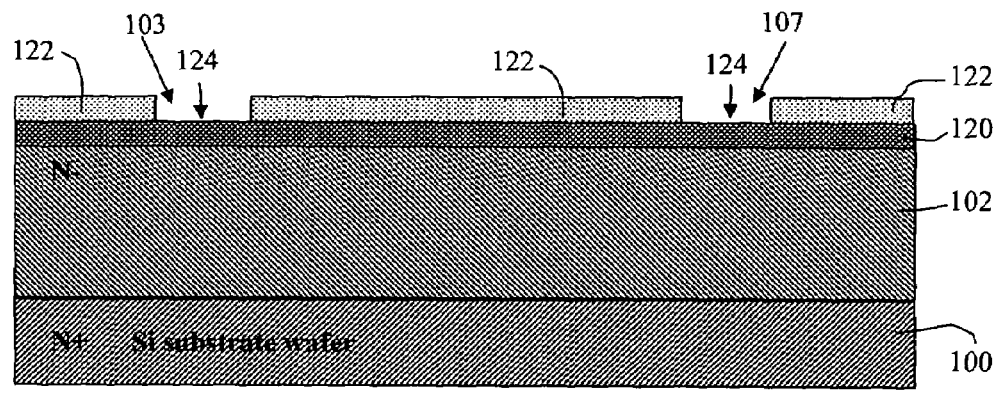
FIGS. 17A, 17B, 17C, and 17D provide a further alternative series of fabrication steps for making two-terminal barrier controlled TVS diodes of the present invention.
Figure 17B:
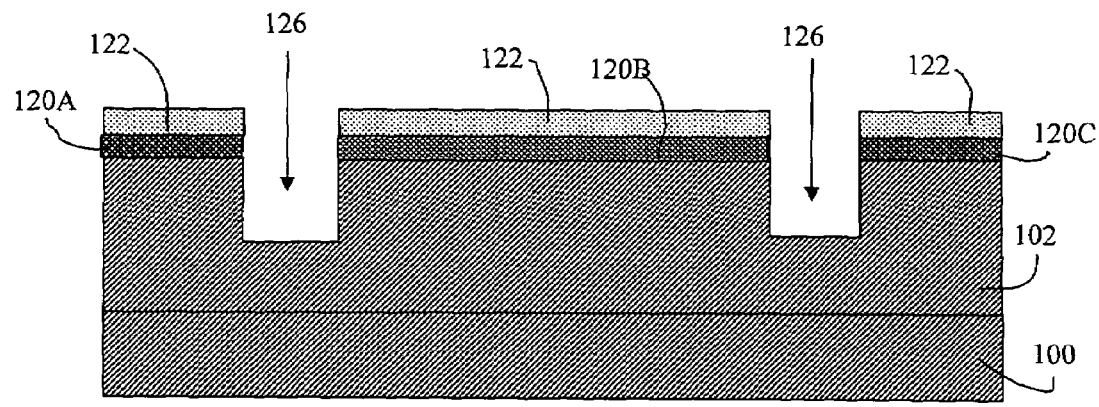
Figure 17C:
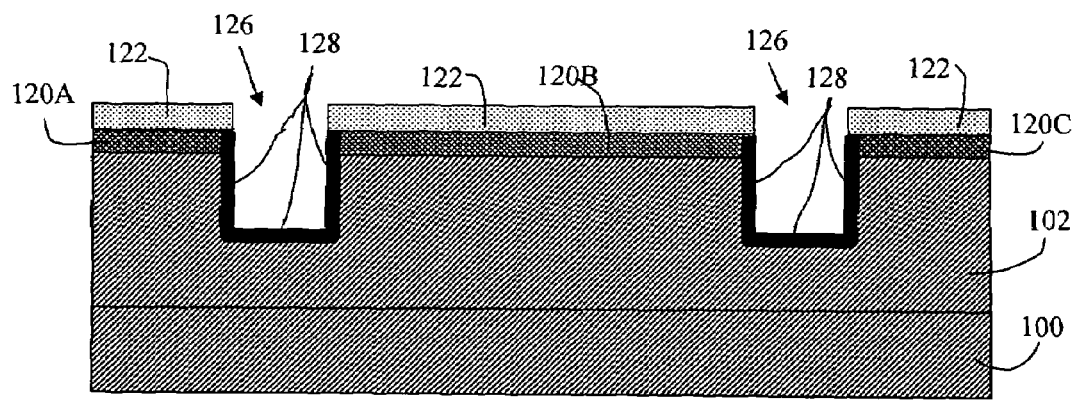
Figure 17D:
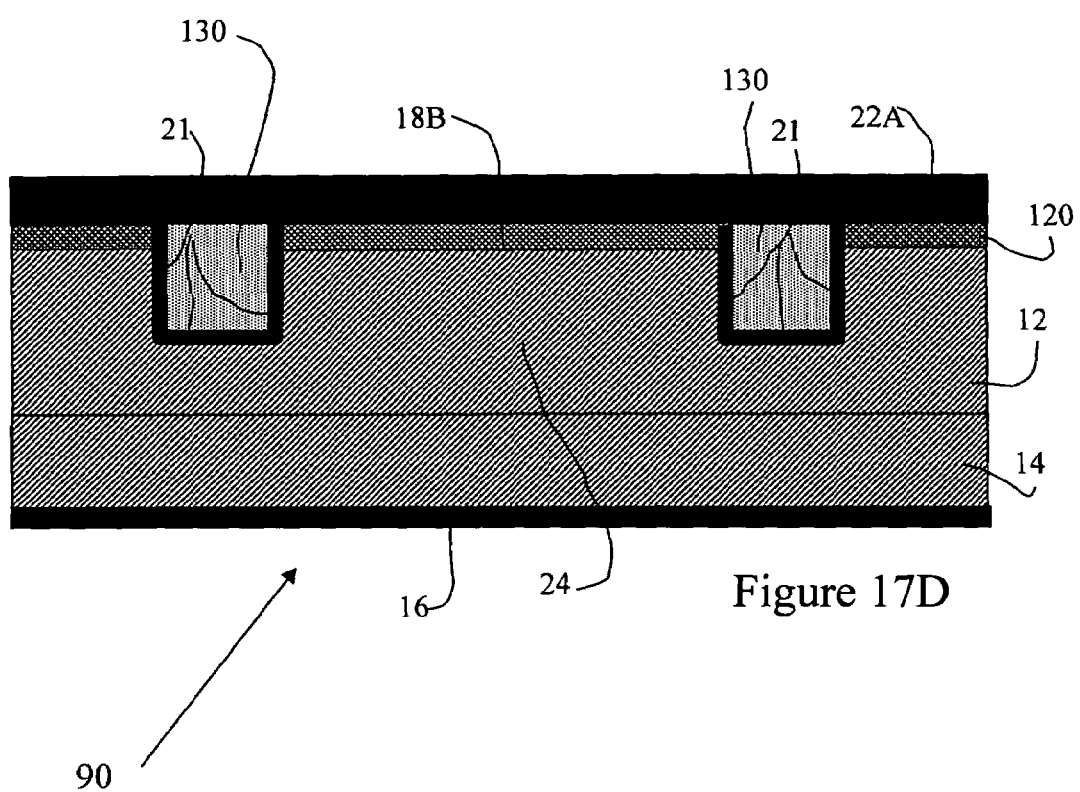

FIGS. 17A, 17B, 17C and 17D illustrate yet another preferred method for making two-terminal trench-isolated barrier controlled TVS diodes in accordance with principles of the present invention. In FIG. 17A an N+ doped silicon substrate wafer is subjected to epitaxy to form an N− epitaxial layer 102. An ion implantation or diffusion step forms a cathode layer 120 upon the frontside outer surface of epitaxial layer 102. A silicon dioxide mask layer 122 is then deposited over the cathode layer 120, and the mask layer 122 is then patterned and etched to define gate openings 103 and 107 at a step 124. As shown in FIG. 17B a trench etch process 126 is carried out through gate openings 103 and 105 by step 126. Gate trenches extend through the cathode layer 120, dividing it into segments 120A, 120B and 120C and relatively deeply into the epitaxial layer 102. As shown in FIG. 17C, a P+ deposition of dopant is carried out along exposed walls of the gate trenches formed by step 126, and resultant P+ gate layers 128 are provided by subjecting the wafer to a diffusion step. As shown in FIG. 17D, silicon dioxide is deposited to backfill the gate trenches at a step 130; the silicon dioxide mask layer 122 is removed and a planarization process is carried out at the frontside of the wafer. A metal (e.g. Al) layer is then deposited onto the planarized frontside of the epitaxial layer 102 to form cathode electrode 22A which interconnects cathode 18B with trench-isolated gate regions 21. A metal layer is also formed along the backside outer surface of wafer 100 to form anode electrode 16 that connects to anode region 14 of a completed barrier controlled TVS diode 90.

Those skilled in the art will appreciate that a bipolar two-terminal barrier controlled TVS diode array may be formed of parallel-connected complementary TVS diodes formed separately or in a common substrate in a side-by-side arrangement with suitable isolation or at opposite major faces thereof.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting.

What is claimed is:

1. A two-terminal unipolar short channel barrier controlled transient voltage suppression (TVS) diode for forward conduction at a predetermined clamping voltage level above a level associated with conventional semiconductor material doping level and junction type of a semiconductor diode, and comprising a semiconductor substrate including:
   (a) a backside anode electrode conductor layer formed along a back surface of the substrate;
   (b) an anode region extending to a predetermined thickness in the substrate next to the anode electrode conductor layer and being doped with majority carriers in a first concentration;
   (c) a transverse channel region extending in the substrate between a lower surface of the anode region and a frontside surface of the substrate, the transverse channel region being lightly doped with majority carriers in a second concentration much lower than the first concentration;
   (d) a cathode region formed in the substrate along the frontside surface to a predetermined thickness in the substrate and being doped with majority carriers of the first type in a third concentration much higher than the second concentration;
   (e) gate control regions formed in the substrate along the frontside surface and adjacently confronting the cathode region and being doped with minority carriers in a predetermined high concentration and to a predetermined depth into the transverse channel region; the predetermined depth of each of the gate control regions in the substrate being at least as great as a distance between the two gate control regions and including the cathode region; and (f) a frontside cathode electrode conductor layer formed along the topside surface of the substrate and electrically interconnecting the cathode region and the two gate control regions; the semiconductor structure being so arranged to create a depletion region barrier blocking majority carrier flow through the channel region at the vicinity of the cathode region at bias levels below the predetermined clamping voltage applied between the anode electrode and the cathode electrode.

2. The TVS diode set forth in claim 1 wherein the substrate comprises an epitaxial layer and wherein the transverse channel, cathode region and gate control regions are formed in the epitaxial layer.

3. The TVS diode set forth in claim 1 wherein the majority carriers are electrons and the minority carriers are holes.

4. The TVS diode set forth in claim 1 wherein the cathode region is spaced away from the gate control regions.

5. The TVS diode set forth in claim 1 wherein the cathode region overlaps the gate control regions.

6. The TVS diode set forth in claim 1 wherein the gate control regions are formed in trenches defined in the transverse channel region.

7. The TVS diode set forth in claim 6 wherein the trenches provide trench isolation for the TVS diode.

8. The TVS diode set forth in claim 6 wherein the gate control regions are formed as impurity diffusions at sidewalls of the trenches.

9. The TVS diode set forth in claim 8 wherein the trenches are backfilled with a dielectric material after receiving sidewall impurity diffusions.

10. The TVS diode set forth in claim 6 wherein the gate control regions are formed as diffusions along bottom walls of the trenches.

11. The TVS diode set forth in claim 1 wherein the gate control regions have a depth into the substrate that is at least equal to a width separating facing portions of the gate control regions adjacently confronting the cathode region.

12. A two-terminal short channel barrier controlled transient voltage suppression (TVS) diode having conductivity modulation for forward conduction at a predetermined clamping voltage level above a level associated with conventional semiconductor material doping level and junction type of a semiconductor diode, and comprising a semiconductor substrate including:

(a) a backside anode electrode conductor layer formed along a back surface of the substrate;

(b) an anode region extending to a predetermined depth in the substrate next to the anode electrode conductor layer and being highly doped with minority carriers in a first minority carrier concentration;

(c) a transverse channel region extending in the substrate between a lower surface of the anode region and a frontside surface of the substrate, the transverse channel region being lightly doped with majority carriers in a first majority carrier concentration;

(d) a cathode region formed in the substrate along the frontside surface to a predetermined depth in the substrate and being doped with majority carriers of the first type in a second majority concentration much higher than the first majority carrier concentration;

(e) two gate control regions formed in the substrate along the frontside surface and adjacently confronting the cathode region and being doped with minority carriers in a predetermined high second minority carrier concentration and to a predetermined depth into the transverse channel region; the predetermined depth of each of the gate control regions in the substrate being at least as great as a distance between the two gate control regions and including the cathode region; and (f) a frontside cathode electrode conductor layer formed along the frontside surface of the substrate and electrically interconnecting the cathode region and the two gate control regions;

the semiconductor structure being so arranged to create a depletion region barrier blocking majority carrier flow through the channel region at the vicinity of the cathode region at bias levels below the predetermined clamping voltage applied between the anode electrode and the cathode electrode, and the anode region providing conductivity modulation by injection of minority carriers into the channel region during conduction of the semiconductor structure at and above the predetermined clamping voltage.

13. The TVS diode set forth in claim 12 wherein the substrate comprises an epitaxial layer and wherein the transverse channel, cathode region and gate control regions are formed in the epitaxial layer.

14. The TVS diode set forth in claim 12 wherein the majority carriers are electrons and the minority carriers are holes.

15. The TVS diode set forth in claim 12 wherein the cathode region is spaced away from the gate control regions.

16. The TVS diode set forth in claim 12 wherein the cathode region overlaps the gate control regions.

17. The TVS diode set forth in claim 12 wherein the gate control regions are formed in trenches defined in the transverse channel region.

18. The TVS diode set forth in claim 17 wherein the trenches provide trench isolation for the TVS diode.

19. The TVS diode set forth in claim 17 wherein the gate control regions are formed as impurity diffusions at sidewalls of the trenches.

20. The TVS diode set forth in claim 17 wherein the trenches are backfilled with a dielectric material after receiving sidewall impurity diffusions.

21. The TVS diode set forth in claim 17 wherein the gate control regions are formed as diffusions along bottom walls of the trenches.

* * * * *